US006150282A

United States Patent [19]
Rath et al.

[11] Patent Number: 6,150,282
[45] Date of Patent: Nov. 21, 2000

[54] SELECTIVE REMOVAL OF ETCHING RESIDUES

[75] Inventors: David L. Rath, Stormville, N.Y.; Rangarajan Jagannathan, Essex Junction, Vt.; Kenneth J. McCullough, Fishkill, N.Y.; Harald F. Okorn-Schmidt, Putnam Valley, N.Y.; Karen P. Madden, Poughquag, N.Y.; Keith R. Pope, Danbury, Conn.

[73] Assignee: International Business Machines Corporation, Armonk, N.Y.

[21] Appl. No.: 08/969,593

[22] Filed: Nov. 13, 1997

[51] Int. Cl.$^7$ .................................................. H01L 21/302
[52] U.S. Cl. ................... 438/745; 134/2; 134/3; 438/906
[58] Field of Search .................... 438/906, 745; 134/2, 3

[56] References Cited

U.S. PATENT DOCUMENTS

| | | | |
|---|---|---|---|
| 3,676,240 | 7/1972 | Retajczyk | 156/17 |
| 3,935,117 | 1/1976 | Suzuki et al. | 252/79.1 |
| 3,979,241 | 9/1976 | Maeda et al. | 156/13 |
| 4,230,523 | 10/1980 | Gagda | 156/657 |
| 4,267,013 | 5/1981 | Iida et al. | 156/643 |
| 4,269,654 | 5/1981 | Deckert et al. | 156/657 |
| 4,285,763 | 8/1981 | Coldren | 156/643 |
| 4,325,984 | 4/1982 | Galfo et al. | 427/38 |
| 4,334,349 | 6/1982 | Aoyama et al. | 29/579 |
| 4,351,696 | 9/1982 | Radigan | 156/643 |
| 4,395,304 | 7/1983 | Kern et al. | 156/657 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,767 | 2/1990 | McConnell et al. | 134/56 R |
| 4,962,049 | 10/1990 | Chang et al. | 437/13 |
| 4,971,715 | 11/1990 | Armant et al. | 252/143 |
| 4,985,113 | 1/1991 | Fujimoto et al. | 156/643 |
| 4,985,990 | 1/1991 | Cronin et al. | 29/852 |
| 4,987,101 | 1/1991 | Kaanta et al. | 437/228 |
| 5,012,692 | 5/1991 | Nagano | 74/475 |
| 5,037,506 | 8/1991 | Gupta et al. | 156/646 |
| 5,082,518 | 1/1992 | Molinaro | 156/345 |
| 5,139,624 | 8/1992 | Searson et al. | 204/129.3 |
| 5,217,570 | 6/1993 | Kadomura | 156/665 |
| 5,308,440 | 5/1994 | Chino et al. | 156/664 |
| 5,334,332 | 8/1994 | Lee | 252/548 |
| 5,338,416 | 8/1994 | Mlcak et al. | 204/129.3 |
| 5,348,619 | 9/1994 | Bohannon et al. | 156/664 |
| 5,348,627 | 9/1994 | Propst et al. | 204/129.3 |
| 5,350,488 | 9/1994 | Webb | 156/643 |
| 5,387,361 | 2/1995 | Kohara et al. | 252/79.1 |
| 5,407,860 | 4/1995 | Stoltz et al. | 437/180 |
| 5,419,779 | 5/1995 | Ward | 134/38 |
| 5,431,766 | 7/1995 | Propst et al. | 156/345 |
| 5,461,003 | 10/1995 | Havemann et al. | 437/187 |
| 5,468,342 | 11/1995 | Nulty et al. | 156/643.1 |
| 5,475,267 | 12/1995 | Ishii et al. | 257/752 |
| 5,533,635 | 7/1996 | Man | 216/67 |
| 5,544,776 | 8/1996 | Okuda et al. | 216/83 |
| 5,556,482 | 9/1996 | Ward et al. | 134/38 |
| 5,571,447 | 11/1996 | Ward et al. | 510/206 |
| 5,591,299 | 1/1997 | Seaton et al. | 156/626.1 |
| 5,650,041 | 7/1997 | Gotoh et al. | 156/653.1 |
| 5,698,503 | 12/1997 | Ward et al. | 510/176 |
| 5,709,756 | 1/1998 | Ward et al. | 134/1.3 |
| 5,756,402 | 5/1998 | Jimbo | 438/724 |
| 5,780,363 | 7/1998 | Delehanty et al. | 438/748 |
| 5,824,601 | 10/1998 | Dao | 438/713 |

FOREIGN PATENT DOCUMENTS

| | | | |
|---|---|---|---|
| 238622 | 8/1986 | Germany | C09K 13/08 |
| 56-161677 | 12/1981 | Japan . | |
| 58-110078 | 6/1983 | Japan . | |
| 58-143532 | 8/1983 | Japan | H01L 21/30 |
| 58-204540 | 11/1983 | Japan . | |

OTHER PUBLICATIONS

Anon, Flush Fluids for Ink Jet Ink Devices, *Research Disclosure*, Jan. 1991, No. 321.

"Etching SiO$_2$ Films In Aqueous 0.49% HF", Somashekhar et al, *J. Electrochem. Soc.*, vol. 143, No. 9, pp. 2885–2891, Sep. 1996.

El–Kareh, B., *Fundamentals of Semiconductor Processing Technologies*, Kluwer Academic Publishers, Norwell, MA, 1995: 565–571.

*Primary Examiner*—Edward J. Cain
*Attorney, Agent, or Firm*—Pollock, Vande Sande & Amernick; Jay H. Anderson

[57] ABSTRACT

Etching residue is selectively removed employing a substantially non-aqueous composition containing a fluoride containing compound and certain organic solvents. Preferred compositions also include an anhydride.

40 Claims, No Drawings

SELECTIVE REMOVAL OF ETCHING RESIDUES

TECHNICAL FIELD

The present invention is concerned with selectively removing etching residues from a substrate and particularly selectively removing residues without attacking metal also exposed to the composition used for removing the residues. In addition, the present invention is concerned with certain cleaning compositions that are suitable for removing etching residues.

BACKGROUND ART

In the fabrication of microelectronic components, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

Increasingly, reactive ion etching (RIE), plasma etching and ion milling are being used to define the pattern in a substrate and to form vias. For instance, in complex semiconductor devices such as advanced DRAMS and logic devices with multiple layers of back end of line interconnect wiring, reactive ion etching is used to produce vias through the interlayer dielectric to provide contact between one level of silicon, silicide or metal wiring to the next level of wiring. These vias typically expose Al, AlCu, Cu, Ti, TiN, Ta, TaN, silicon or a silicide such as a silicide of tungsten, titanium or cobalt. The RIE process leaves a residue of a complex mixture that may include re-sputtered oxide material and possibly small amounts of organic material from the resists used to delineate the vias.

It would therefore be desirable to provide a selective cleaning procedure capable of removing the residues caused by the etching and especially a plasma, RIE or ion milling etching. Moreover, it would be desirable to provide a selective cleaning procedure capable of removing the etching residue that exhibits high selectivity for the residue as compared to metal, silicon, silicide and/or interlevel dielectric materials such as deposited oxides that might also be exposed to the cleaning composition.

SUMMARY OF INVENTION

The present invention is concerned with a method for selectively removing etching residues. The process of the present invention comprises contacting an article that contains etching residues and metal, silicon, silicate and/or interlevel dielectric materials with a cleaning composition that contains about 0.05 to about 3 molar of a fluoride containing compound and an organic solvent to thereby selectively remove the etching residue at a rate greater than the rate for the metal, silicon, silicide and/or interlevel dielectric materials.

In addition, the present invention is concerned with certain preferred cleaning compositions that are capable of selectively removing etching residues at a rate greater than the rate for the metal, silicon, silicide and/or interlevel dielectric materials. The preferred compositions of the present invention contain about 0.05 to about 3 molar of a fluoride containing compound and an organic solvent.

The organic solvents employed in the present invention typically have relatively high flash point and provide low viscosity compositions. Suitable solvents include sulfolanes, oxolanes, esters, ketones, aldehydes, lactones, halogenated hydrocarbons, alcohols including mono- and polyhydric alcohols, amines and imides.

Other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

The present invention is concerned with selectively removing etching residues and especially residues caused by forming vias by reactive ion etching. Moreover, the etching residues are present in an article that also includes metal, silicon, silicate and/or interlevel dielectric material such as deposited silicon oxides, wherein both the residues and the metal, silicon, silicide and/or interlevel dielectric materials will come in contact with the cleaning composition. The present invention provides for selectively removing the residues at a rate of at least about 100 times, preferably at least about 250 and most preferably at least about 500 times the rate for the metal, silicon, silicide and interlevel dielectric materials. The metal is typically copper, copper alloy, titanium, titanium nitride, tantalum, tantalum nitride, aluminum and/or aluminum alloy. The residues removed according to the present invention are preferably those created by reactive ion etching of vias.

The cleaning compositions employed pursuant to the present invention are preferably non-aqueous and contain a compound containing fluoride and an organic solvent. The amount of the fluoride containing compound in the composition is about 0.05 to about 3 molar, and preferably about 0.2 to about 2.5 molar, and most preferably about 0.25 to about 1.5 molar.

Typical compounds providing a fluoride source according to the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, a fluoride salt of an aliphatic primary, secondary or tertiary amine can be used. Such have the following formula:

wherein $R_1$, $R_2$ and $R_3$ each individually represents H or an alkyl group.

Typically, the total number of carbon atoms in the $R_1$, $R_2$ and $R_3$ groups is 12 carbon atoms or less. The preferred fluoride compounds are hydrogen fluoride and ammonium fluoride.

The hydrogen fluoride is typically added as a 49 weight percent aqueous solution. When the fluoride is added as an aqueous composition, it is preferred to add a component capable of rendering the composition at least substantially non-aqueous. Substantially non-aqueous refers to non-aqueous as well as containing water of up to 20 and preferably up to 3% by weight of the fluoride content. Such component is referred to herein as a dehydrating agent. Suitable dehydrating agents are alkyl anhydrides and aryl anhydrides. The alkyl group typically contains 1–8 carbon atoms and the aryl group typically contains 6–9 carbon atoms in the ring. The aryl groups can be substituted on the ring with an alkyl group containing 1–8 carbon atoms. Typical anhydrides are acetic anhydride, benzyl anhydride, phenyl anhydride. Of course the dehydrating agent must not adversely affect to an undesirable extent the cleaning ability characteristics of the composition.

Typically, the amount of the anhydride is at least one anhydride group (O=COC=O) per $H_2O$ molecule, and preferably at least about a 5% excess and more preferably at least about 10% excess of one anhydride group per $H_2O$ molecule. Usually the excess will not be greater than about 25%. However, when a small amount of water can be tolerated (i.e.—0.1 to 20% and more typically 0.1 to 3% by weight based upon the weight of the fluoride content), the anhydride will be used in an amount less than one anhydride group per $H_2O$ molecule to correspond to the small amount of water.

In the alternative, the cleaning composition can be produced by adding the fluoride as a non-aqueous component such as by bubbling anhydrous HF gas into an organic solvent or by adding an organic fluoride. Also, the anhydrous compositions can be prepared by admixing an aqueous solution of the fluoride compound with the organic solvent and then heating the composition to evaporate water.

Examples of suitable organic compounds include oxolanes, sulfolanes, esters, ketones, aldehydes, lactones, halogenated solvents, amines, imides and alcohols. Examples of suitable esters are esters of carbonic acids, benzoic acid, phthalic acid, isophthalic acid and terephthalic acid, and especially the $C_1$–$C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids. The more preferred solvents employed pursuant to the present invention are propylene carbonate, N-methylpyrrolidone and gamma butyrolactone, ethylene glycol and propylene glycol with propylene carbonate being the most preferred.

Organic solvents employed in the present invention provide for low viscosity compositions, which in turn render the compositions more workable and providing for better etch uniformity. This is especially so when compared to using glycerol.

In addition, the compositions can include a tertiary amine to facilitate removing any photoresist residue that might be remaining after the etching. Typical examples are represented by the formula $R_4N(R_5)R_6$ wherein each individually represents alkyl, aryl, alkaryl, aralkyl and substituted derivatives such as those containing one or more hydroxyl or anhydride groups. The alkyl groups typically contain 1–12 carbon atoms and the aryl groups typically contain 6–14 carbon atoms. Typical tertiary amines are N N,N',N'-tetramethyl ethylenediamine and triethanol amine. When present, the tertiary amine is typically present in amounts of about 0.05 to about 5 volume percent, and more typically about 1 to about 3 volume percent.

The cleaning process of the present invention is typically carried out at temperatures of about 20° C. to about 90° C., and preferably about 30° C. to about 70° C. Employing increased temperature results in increasing the removal rates of the residues but not necessarily the rates for the metal, silicon, silicide and interlevel dielectric material, thereby increasing the selectivity of removing the residues.

The following non-limiting examples are presented to further illustrate the present invention.

EXAMPLE 1

A cleaning composition is prepared by admixing one part by volume of a 49 percent by weight aqueous solution of HF with about 28 parts by volume of propylene carbonate to provide a 1 molar HF solution in propylene carbonate; and acetic anhydride in an amount to provide about 1.5 molar solution of the acetic anhydride. A patterned silicon wafer containing vias formed by reactive ion etching (RIE) through interlevel dielectric of silicon dioxide where the vias expose aluminum conductive units, is immersed in the cleaning composition. The cleaning is carried out at a temperature of about 35° C. for about 4 minutes. The cleaning solution removes the RIE residues without removing any of the aluminum.

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A method for selectively removing etching residues which comprises contacting an article containing said residues and at least one member selected from the group consisting of metal, silicon, silicide and interlevel dielectric materials with a substantially non-aqueous cleaning composition containing about 0.05 to about 3 molar of a fluoride containing compound and an organic solvent, to thereby selectively etch said residues at a rate greater than said member.

2. The method of claim 1 wherein said residues are caused by an etching process selected from the group consisting of plasma etching, reactive ion etching and ion milling.

3. The method of claim 1 wherein said residues are caused by reactive ion etching.

4. The method of claim 1 wherein said solvent is selected from the group consisting of oxolanes, sulfolanes, esters, ketones, aldehydes, lactones, halogenated hydrocarbons, alcohols, amines and imides.

5. The method of claim 1 wherein said organic solvent is selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthalic acid and terephthalic acid.

6. The method of claim 1 wherein said organic solvent is selected from the group consisting of propylene carbonate, N-methyl pyrrolidone and gamma butyrolactone.

7. The method of claim 1 wherein said solvent is propylene carbonate.

8. The method of claim 1 wherein said fluoride containing compound is selected from the group consisting of hydrofluoric acid, ammonium fluoride, fluoroborates, tetrabutylammonium tetrafluoroborate, fluoroboric acid, aluminum hexafluoride, tin biflouride, antimony fluoride and fluoride salt of an aliphatic primary, secondary or tertiary amine.

9. The method of claim 1 wherein said fluoride containing compound is hydrofluoric acid or ammonium fluoride.

10. The method of claim 1 wherein said fluoride containing compound is hydrofluoric acid.

11. The method of claim 1 wherein said composition also contains an anhydride.

12. The method of claim 11 wherein said anhydride is an alkyl anhydride or aryl anhydride.

13. The method of claim 11 wherein said anhydride is acetic anhydride.

14. The method of claim 11 wherein the amount of said anhydride is at least one anhydride group per water molecule in said composition.

15. The method of claim 1 wherein said cleaning composition contains water in an amount of up to 20% by weight of said fluoride.

16. The method of claim 1 wherein said cleaning composition is free from water.

17. The method of claim 1 wherein the amount of said fluoride is about 0.2 to about 2.5 molar.

18. The method of claim 1 wherein the amount of said fluoride is about 0.25 to about 1.5 molar.

19. The method of claim 1 wherein the contacting with said composition is carried out at a temperature of about 20° C. to about 90° C.

20. The method of claim 1 wherein the contacting with said composition is carried out at a temperature of about 30° C. to about 70° C.

21. The method of claim 1 wherein said composition also contains a tertiary amine.

22. The method of claim 1 wherein said tertiary amine is N,N,N',N'tetramethyl ethylenediamine.

23. The method of claim 21 wherein the amount of said tertiary amine is about 0.05 to about 5 volume percent.

24. A substantially non-aqueous cleaning composition suitable for removing etching residue and containing about 0.05 to about 3.0 molar of a fluoride containing compound, an organic solvent and positive amount of an anhydride sufficient to render said composition substantially non-aqueous wherein said organic solvent is selected from the group consisting of oxolanes, sulfolanes, esters, ketones, aldehydes, lactones, halogenated hydrocarbons, alcohols, amines and imides.

25. The cleaning composition of claim 24 wherein said organic solvent is selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthalic acid and terephthalic acid.

26. The cleaning composition of claim 24 wherein said organic solvent is selected from the group consisting of propylene carbonate, N-methyl pyrrolidone and gamma butyrolactone.

27. The cleaning composition of claim 24 wherein said solvent is propylene carbonate.

28. The cleaning composition of claim 24 wherein said fluoride containing compound is selected from the group consisting of hydrofluoric acid, ammonium fluoride, fluoroborates, tetrabutylammonium tetrafluoroborate, fluoroboric acid, aluminum hexafluoride, tin bifluoride, antimony fluoride, and fluoride salt of an aliphatic primary, secondary or tertiary amine.

29. The cleaning composition of claim 24 wherein said fluoride containing compound is hydrofluoric acid or ammonium fluoride.

30. The cleaning composition of claim 24 wherein said fluoride containing compound is hydrofluoric acid.

31. The cleaning composition of claim 24 wherein the amount of water is up to 20% by weight of said fluoride.

32. The cleaning composition of claim 24 being non-aqueous.

33. The cleaning composition of claim 24 wherein the amount of said fluoride is about 0.2 to about 2.5 molar.

34. The cleaning composition of claim 24 wherein said anhydride is acetic anhydride.

35. The cleaning composition of claim 24 wherein said composition also includes a tertiary amine.

36. The cleaning composition of claim 35 wherein said tertiary amine is N,N,N',N'tetramethyl ethylenediamine.

37. The cleaning composition of claim 35 wherein the amount of said tertiary amine is about 0.05 to about 5 volume percent.

38. A substantially non-aqueous cleaning composition suitable for removing etching residue and containing about 0.05 to about 3.0 molar of a fluoride containing compound, an organic solvent and positive amount of an anhydride sufficient to render said composition substantially non-aqueous, and further comprising a tertiary amine.

39. The cleaning composition of claim 38 wherein said tertiary amine is N,N,N',N'tetramethyl ethylenediamine.

40. The cleaning composition of claim 38 wherein the amount of said tertiary amine is about 0.05 to about 5 volume percent.

* * * * *